(12) United States Patent
Sailer

(10) Patent No.: US 9,582,032 B2
(45) Date of Patent: Feb. 28, 2017

(54) DEVICE ARRANGEMENT, IN PARTICULAR FOR USE IN AN EXPLOSION-PRONE AREA

(71) Applicant: ECOM Instruments GmbH, Assamstadt (DE)

(72) Inventor: Axel Sailer, Weikersheim (DE)

(73) Assignee: ECOM Instruments GmbH (DE)

(*) Notice: Subject to any disclaimer, the term of this patent is extended or adjusted under 35 U.S.C. 154(b) by 0 days.

(21) Appl. No.: 14/677,676

(22) Filed: Apr. 2, 2015

(65) Prior Publication Data
US 2015/0286250 A1   Oct. 8, 2015

(30) Foreign Application Priority Data
Apr. 3, 2014   (DE) .................. 10 2014 206 433

(51) Int. Cl.
*H04M 1/00*  (2006.01)
*G06F 1/16*  (2006.01)
*G06F 1/18*  (2006.01)
*H05K 5/06*  (2006.01)

(52) U.S. Cl.
CPC .......... *G06F 1/1626* (2013.01); *G06F 1/1656* (2013.01); *G06F 1/182* (2013.01); *H05K 5/068* (2013.01)

(58) Field of Classification Search
CPC .................................................... G06F 1/1626
USPC .................................................... 455/575.8
See application file for complete search history.

(56) References Cited

U.S. PATENT DOCUMENTS

2015/0091148 A1*  4/2015  Boenig .................. H01L 23/16
                                                                257/683

FOREIGN PATENT DOCUMENTS

DE       261063 A3     10/1988
DE     19860383 A1      7/2000

OTHER PUBLICATIONS

English abstract for DE-19860383.
German Office Action for DE-102014206433.3, mailed Dec. 16, 2014.

* cited by examiner

*Primary Examiner* — Sanh Phu
(74) *Attorney, Agent, or Firm* — Fishman Stewart PLLC

(57) ABSTRACT

A device arrangement may include an electronic device at least partially enclosed in a device casing. A casing may at least partially delimit a casing interior. The device casing may be disposed in the casing interior. A pressure reduction device may be arranged in the device casing and be configured to reduce a gas pressure of an ignitable gas mixture disposed in at least one of the casing and the device casing. The pressure reduction device may include at least one damping element and a stabilizing device at least partially encasing the at least one damping element.

18 Claims, 1 Drawing Sheet

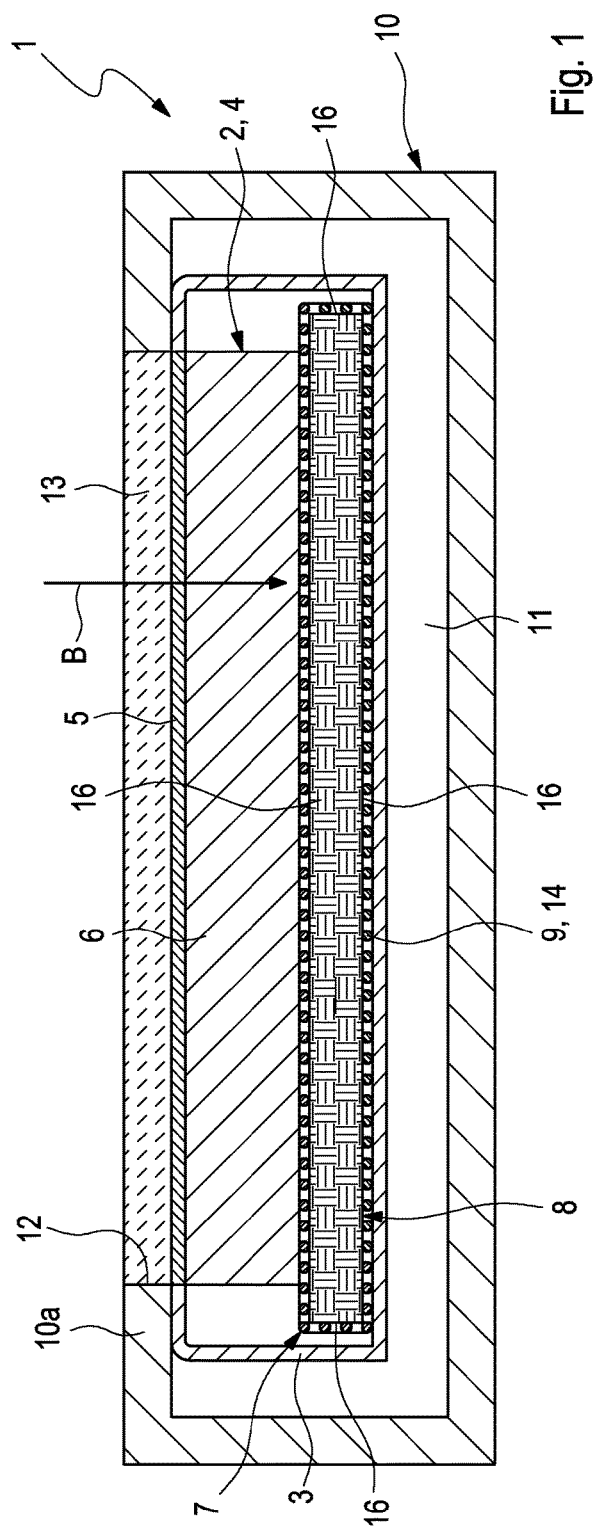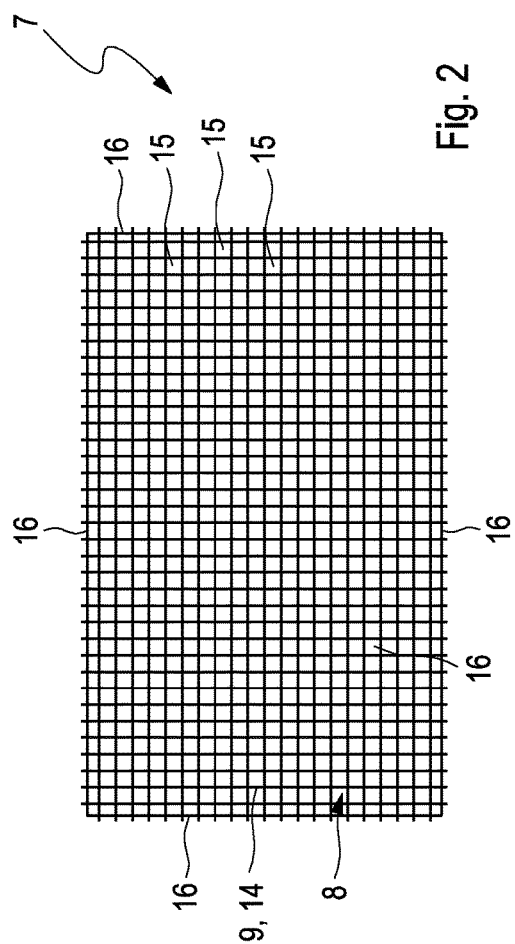

DEVICE ARRANGEMENT, IN PARTICULAR FOR USE IN AN EXPLOSION-PRONE AREA

CROSS-REFERENCE TO RELATED APPLICATIONS

This application claims priority to German Patent Application No. 10 2014 206 433.3, filed Apr. 3, 2014, the contents of which are hereby incorporated by reference in their entirety.

TECHNICAL FIELD

The invention relates to a device arrangement, in particular for use in an explosion-prone area.

BACKGROUND

In explosion-prone areas, for example, on drilling rigs, the electrical energies present at the external electronic interfaces of an electronic device can ignite a gas-air mixture present in the explosion-prone area and thus cause an explosion. This applies particularly to highly reactive gas mixtures such as possibly mixtures of hydrogen and oxygen, for which said energy is available as activation energy in order to initiate an exothermic reaction possibly of hydrogen and oxygen to give water. The same applies to gas mixtures of acetylene-oxygen.

Against this background it is known from the prior art to provide pressure-resistant casings in which the electronic device to be used in the explosion-prone area can be received. It is further known to use additional damping elements in said pressure-tight casings in order to minimize the explosion pressure which develops during the ignition of the gas mixture and acts on the casing. This permits the pressure-resistant casing to be provided with thinner and therefore lighter-weight casing walls which increases the user friendliness of such a casing not inconsiderably.

Against this background DE 198 60 383 A1 discloses an electronic device in the form of a screen for an EDP system which comprises a pressure-tight casing with a transparent pane. An LCD display and an explosion pressure damping material are provided in the interior of the casing.

On the other hand, DD 261 063 A3 describes an arrangement for reducing explosion pressures in closed spaces. The arrangement comprises a casing in which an incombustible material having open continuous pores or gaps is arranged largely freely accessibly. Such a casing is fundamentally also suitable for receiving an electronic device.

The typically "soft" structure of the material which damps the explosion process proves to be problematical in such conventional casings with devices for reducing the pressure in the event of an explosion. The only low structural strength of this material can, in the event of an explosion, have the result that it is damaged or completely destroyed so that its functionality as a pressure-reducing component cannot be guaranteed with absolute certainty. This is however absolutely essential if a casing for an electronic device is to receive the certification required for use in an explosion-prone area.

SUMMARY

It is therefore an object of the present invention to provide an improved embodiment of a casing arrangement with an electronic device in an explosion-prone area.

The basic idea of the invention is accordingly to install an electronic device, in particular a tablet computer, in a pressure-resistant casing and additionally to provide a pressure reduction device comprising a damping element in the device casing of the electronic device. If an explosion occurs in the device casing of the electronic casing, possibly because the electronic device becomes overheated due to a fault and an explosive gas mixture which has penetrated from the surroundings into the interior of the electronic device ignites, the explosion pressure produced during the explosion and ultimately acting both on the device casing and also on the casing of the device arrangement can be reduced appreciably with the aid of the damping element.

The damping element having damping properties brings about a not inconsiderable reduction in the speed of the gas atoms or gas molecules in the event of an explosion. Essential to the invention in this case is a stabilising device which at least partially, preferably completely surrounds the damping element which prevents any destruction of the per se "soft" material of the damping element as a result of the expansion of the ignited gas by ensuring the required structural strength of the damping element.

If the device casing in the event of an explosion is destroyed by the expanding gas despite the gas pressure reduced with the aid of the pressure reduction device, the outer casing of the device arrangement presented here, which is typically designed to be pressure-resistant, can in any case withstand the remaining gas pressure of the ignited gas. The device arrangement according to the invention presented here is therefore suitable for use of an electronic device mounted in the casing of the device arrangement in an explosion-prone area.

A particularly good reduction in pressure with the aid of the at least one damping element is achieved in a preferred embodiment in which the damping element is completely encased by the stabilising device.

The same applies for a flat configuration and arrangement of the damping element in the device casing.

A particularly good mechanical stabilisation of the damping element in the case of an explosion is achieved if the stabilising device has a mesh-like structure on which the damping elements can be supported with its outer surface. In this way, on the one hand it can be prevented that the material of the damping element can only insufficiently withstand or not withstand at all the explosion pressure in the course of the explosion-like expansion of the ignited gas and thus cannot bring about any appreciable pressure reduction; this is because the mesh-like structure enables an appreciable mechanical stabilisation of the material of the damping element. On the other hand, the mesh-like configuration of the stabilising device also allows the expansion of the exploding gas through the through openings formed by the mesh-like structure, which is required to reduce the pressure.

In an advantageous further development, the stabilising device can be configured as a wire mesh at least partially surrounding the damping element in such a manner that the damping element abuts with at least one outer side inside against the wire mesh. The configuration as wire mesh results in cost advantages in the manufacture of the stabilising device.

According to an advantageous further development it is proposed to configure the stabilising device in such a manner that it surrounds the damping element in a cage-like manner. In this way, the structural strength of the damping element configured as "soft" in regard to its strength can be improved considerably in the event of an explosion compared with conventional damping elements without such a mesh-like stabilising device.

Cost advantages in manufacture are obtained if the mesh structure is made of a metal, preferably of a steel, most preferably of a stainless steel. Since metals typically have a high thermal conductivity, the additional advantageous side effect is obtained when using a metal that the mesh structure can withdraw heat from the gas mixture passing through the mesh structure in the event of an explosion with the result that its gas pressure can be additionally reduced.

Furthermore, particularly good damping effects and therefore in consequence a particular severe pressure reduction of the gas exploded in the casing can be achieved if the material of the damping element comprises or is quartz wool or glass wool or rock wool. Other wool-like and low flammable or completely non-flammable materials can also be considered.

In order to be able to use the casing proposed here in explosion-prone areas as a container for an electronic device, it is proposed to configure the casing of the device arrangements as pressure-resistant. This may be achieved, for example, by making the casing at least partially, preferably completely of a metal.

The pressure-reducing properties of the device arrangement according to the invention presented here can be improved if at least one further damping element with a stabilising device is placed at suitable positions in the device casing, for example, in empty spaces present in the device casing.

Further important features and advantages of the invention are obtained from the subclaims, from the drawings and from the appurtenant description of the figures by reference to the drawings.

It is understood that the features specified hereinbefore and to be explained hereinafter can be used not only in the respectively given combination but also in other combinations or alone without departing from the framework of the present invention.

Preferred exemplary embodiments of the invention are shown in the drawings and are explained in detail in the following description, where the same reference numbers relate to the same or similar or functionally the same components.

BRIEF DESCRIPTION OF THE DRAWINGS

In the figures, in each case schematically

FIG. 1 shows an example of a device arrangement according to the invention in a cross-section, FIG. 2 shows a damping element of the device arrangement in separate view.

DETAILED DESCRIPTION

FIG. 1 illustrates schematically and in a longitudinal section an example of a device arrangement 1 according to the invention. The arrangement 1 comprises a casing 10 designed to be pressure-resistant, which surrounds a casing interior 11. Located in the casing interior 11 is an electronic device 2 which in turn comprises a device casing 3. The electronic device 1 can comprise a tablet computer 4 with a display 5 which has a touchscreen functionality. As can be seen from FIG. 1, further components of the tablet computer 4 such as for example a microprocessor, a random access memory etc. are provided in the device casing 3, which can be partially mounted on suitable support elements such as for example a board. It is also conceivable to locate the rechargeable battery of the tablet computer 4 in the device casing. All these components are combined roughly schematically in FIG. 1 in the component designated by the reference number 6.

A viewing window 12 is located in the casing 10, which viewing window is sealed by a window pane 13 made of a transparent material, for example, of toughened glass. The tablet computer 4 is in this case disposed in such a manner in the casing 10 that the viewing window 12 is substantially aligned with the display 5 of the tablet computer 4. This allows a user to operate the display 5 even when the device 1 is mounted in the casing interior 11 of the casing 10.

The fastening of the electronic device 2 in the casing 10 can be accomplished with the aid of suitable fastening elements, possibly in the form of latching elements (not shown). Alternatively to this it is however also conceivable to adhesively bond the electronic device 1, for example, in the region of its display 5 with the window pane 13 or also a casing wall 10a of the casing 10 which borders the viewing window 12. A fixing by means of a clamping connection familiar to the person skilled in the art is also conceivable.

A pressure reduction device 7 is further provided in the device casing 4, which, in the case of ignition of a gas mixture which has diffused through the casing 10 into the interior of the electronic device 1—for example, through one of the electrical/electronic components 6—is intended to reduce the gas pressure which occurs in the course of the explosion.

For this purpose the pressure reduction device 7 comprises at least one damping element 8 which in turn is at least partially encased by a stabilising device 9. An open-pore glass wool is used as material for the damping element 8. Alternatively a rock or quartz wool can also be used. A use of a metal foam, a glass foam or a foam ceramic is also feasible. The damping element 8 having strong damping properties in the case of an explosion brings about a significant reduction in the speed of the gas atoms or gas molecules when these pass through the wool of the damping element 8 with the result that the pressure of the ignited gas can be reduced appreciably. It is thereby achieved that even in the case of a relatively thin-walled dimensioning of its casing walls, the casing 10 of the device arrangement can withstand the remaining explosion pressure.

Now essential to the invention however is a stabilising device 9 encasing the wool of the damping element 8 which prevents destruction of the wool by increasing the structural strength of the wool in the event of an explosion. This naturally also applies if, instead of wool, a different material is selected for the damping element 8.

In the example scenario of FIG. 1, the stabilising device 9 is formed from a wire mesh 14 which encases the damping element 8, i.e. the stabilising device 9 has a mesh-like structure. A metal, in particular a steel or a stainless steel, is suitable as material for the wire mesh. Said wire mesh 14 brings about an appreciable mechanical stabilisation of the material of the damping element 8. By means of the wire mesh 14 it is prevented on the one hand that the material of the damping element 8 can only inadequately or not at all withstand the developing explosion pressure in the course of the explosion-like expansion of the ignited gas and thus cannot bring about any significant pressure reduction. On the other hand, the through openings 15 formed in the wire mesh 14 allow the expansion of the exploded gas through the wire mesh 14 which is required for the pressure reduction.

A particularly good pressure reduction with the aid of the damping element 8 can be achieved if the damping element 8 is completely encased by the stabilising device 9—in the case of the example scenario therefore by the wire mesh 14. This is shown in the diagram in FIG. 2 which shows the damping element 8 in separate view and in a plan view along a viewing direction B indicated in FIG. 1. It can be seen that the damping element 8 made of open-pore wool, abuts with its outer sides 16 against the wire mesh 14. In other words, the stabilising device 9 shown in FIG. 2 surrounds the damping element 8 in a cage-like manner.

In variants of the example not shown, the pressure-reducing properties of the pressure reduction device 7 can be further improved by providing further damping elements 8 with respective stabilising devices 9 at several suitable positions, for example, at empty spaces present in the device casing 3.

The invention claimed is:

1. A device arrangement, comprising:
   an electronic device at least partially enclosed in a device casing,
   a casing at least partially delimiting a casing interior, wherein the device casing is disposed in the casing interior,
   a pressure reduction device arranged in at least one of the casing and the device casing, the pressure reduction device configured to reduce a gas pressure of an ignitable gas mixture disposed in at least one of the casing and the device casing,
   wherein the pressure reduction device includes at least one damping element and a stabilising device at least partially encasing the at least one damping element, and
   wherein the electronic device includes a display and the casing defines a viewing window for the display, wherein the viewing window is sealed via a window pane composed of a transparent material.

2. A device arrangement, comprising:
   a casing at least partially delimiting a casing interior;
   a device casing disposed in the casing interior, the device casing defining a cavity configured to receive an electronic device;
   a pressure reduction device arranged in at least one of the casing and the device casing, the pressure reduction device configured to reduce a gas pressure of an ignitable gas mixture disposed in at least one of the casing and the device casing, wherein the pressure reduction device includes at least one damping element and a stabilising device at least partially encasing the at least one damping element;
   wherein the at least one damping element is composed of a material including a plurality of open-pores; and
   wherein the casing has a viewing window for a display of the electronic device, and wherein the viewing window is sealed via a window pane composed of a transparent material.

3. The device arrangement according to claim 2, wherein the at least one damping element is flat and disposed in the device casing.

4. The device arrangement according to claim 1, wherein the stabilising device includes a mesh structure supporting the at least one damping element.

5. The device arrangement according to claim 1, wherein the stabilising device includes a wire mesh at least partially surrounding the at least one damping element, wherein the at least one damping element abuts with at least one outer side against an interior of the wire mesh.

6. The device arrangement according to claim 1, wherein the stabilising device includes a cage structure surrounding the at least one damping element, the cage structure defined by a plurality of members extending at least one of parallel to and crossing each other.

7. The device arrangement according to claim 1, wherein the stabilising device includes a mesh structure at least partially surrounding the at least one damping element, wherein the mesh structure is composed of a metal.

8. The device arrangement according to claim 1, wherein the at least one damping element is composed of a material including a plurality of open-pores.

9. The device arrangement according to claim 1, wherein the at least one damping element is composed of at least one of a glass wool material and a quartz wool material.

10. The device arrangement according to claim 1, wherein the casing is composed of a pressure-resistant material.

11. The device arrangement according to claim 1, wherein the casing is at least partially composed of a metal.

12. The device arrangement according to claim 1, wherein a plurality of damping elements are disposed in the device casing.

13. The device arrangement according to claim 1, wherein the stabilising device includes a mesh structure at least partially encasing the at least one damping element, wherein the mesh structure includes a steel wire mesh defining a plurality of through openings.

14. A device arrangement, comprising:
    a casing at least partially delimiting a casing interior;
    a device casing disposed in the casing interior, the device casing delimiting a cavity configured to receive an electronic device; and
    a pressure reduction device arranged in the cavity of the device casing configured to reduce a gas pressure of an ignitable gas mixture dispersed in at least one of the casing interior of the casing and the cavity of the device casing;
    wherein the pressure reduction device includes at least one damping element and a stabilizing device at least partially encasing the at least one damping element, the at least one damping element composed of a material including a plurality of open-pores;
    wherein the stabilizing device includes a mesh structure defined by a plurality of members extending at least one of parallel to and crossing each other, wherein the mesh structure delimits a plurality of through openings configured to facilitate an expansion of the ignitable gas mixture.

15. The device arrangement according to claim 2, wherein the at least one damping element is completely encased by the stabilising device.

16. The device arrangement according to claim 2, wherein the stabilising device includes a mesh structure at least partially surrounding the at least one damping element, and wherein the mesh structure is composed of a metal.

17. The device arrangement according to claim 2, wherein the transparent material of the window pane is glass.

18. The device arrangement according to claim 2, wherein the casing is composed of a pressure-resistant material.

* * * * *